United States Patent [19]

Kato

[11] Patent Number: 5,369,296
[45] Date of Patent: Nov. 29, 1994

[54] SEMICONDUCTOR DEVICE HAVING A FERROELECTRIC FILM IN A THROUGH-HOLE

[75] Inventor: Koji Kato, Suwa, Japan

[73] Assignee: Ramtron International Corporation, Colorado Springs, Colo.

[21] Appl. No.: 139,340

[22] Filed: Oct. 19, 1993

Related U.S. Application Data

[63] Continuation of Ser. No. 842,394, May 12, 1992, abandoned.

[30] Foreign Application Priority Data

Jul. 24, 1990 [JP] Japan ................................. 2-195864

[51] Int. Cl.⁵ ...................... H01L 29/78; G11C 11/22
[52] U.S. Cl. .................................. 257/295; 257/310; 365/145; 361/321.2
[58] Field of Search ...................... 257/295, 296, 314; 365/145

[56] References Cited

U.S. PATENT DOCUMENTS

| | | | |
|---|---|---|---|
| 4,149,302 | 4/1979 | Cook | 29/25.42 |
| 5,046,043 | 9/1991 | Miller et al. | 365/145 |
| 5,099,305 | 3/1992 | Takenaka | 365/145 |
| 5,119,154 | 6/1992 | Gnadinger | 257/295 |
| 5,216,572 | 6/1993 | Larson et al. | 257/295 |

FOREIGN PATENT DOCUMENTS

| | | | |
|---|---|---|---|
| 0338157 | 10/1989 | European Pat. Off. | G11C 11/22 |
| 62-61355 | 3/1987 | Japan . | |
| 2-49471 | 2/1990 | Japan | 257/295 |
| 2-94559 | 4/1990 | Japan . | |
| 2-183569 | 7/1990 | Japan | 257/295 |

*Primary Examiner*—Robert Limanek
*Attorney, Agent, or Firm*—Edward D. Manzo; Mark J. Murphy

[57] ABSTRACT

In a memory construction using ferroelectric film, by embedding a capacitor formed by said ferroelectric film in a through hole bored in an interlayer insulating film formed on a semiconductor substrate, reliability of the wiring layer passing thereover so as to obtain a highly reliable semiconductor memory by reducing the step difference by said capacitor.

16 Claims, 3 Drawing Sheets

SEMICONDUCTOR DEVICE HAVING A FERROELECTRIC FILM IN A THROUGH-HOLE

This is a continuation of application Ser. No. 07/842,394 filed on May 12, 1992 now abandoned.

TECHNICAL FIELD

The present invention relates to a structure of a memory, particularly an electrically rewritable non-volatile memory, with the use of a ferroelectric, and a method of manufacturing the same.

BACKGROUND ART

As a prior semiconductor non-volatile memory, there has commonly been used an MIS-type transistor with the use of a phenomenon of modulating a surface potential of a silicon substrate by injecting a charge from the silicon substrate into a trap or a floating gate in an insulating gate, and practically used as EPROM(ultraviolet erasing type non-volatile memory), EEPROM(electrically rewritable non-volatile memory) and the like.

PROBLEM AND OBJECT TO BE SOLVED OR OBTAINED BY THE INVENTION

However, these non-volatile memories have such disadvantages that an information rewriting voltage is high such as about 20V, rewriting time is very long (such as several ten msec in case of EEPROM) and the like. Moreover, information rewriting number is about $10^2$ times, which is very few and problematic in case of repetitive use.

A non-volatile memory with the use of an electrically polarization reversible ferroelectric, which write-in time and read-out time are substantially the same in principle, and polarization is maintained even if the power supply source is cut off, has the possibility of being an ideal non-volatile memory. As to the non-volatile memory with the use of such ferroelectric, U.S. Pat. No. 4,149,302 proposes a structure integrating a capacitor consisting of a ferroelectric on a silicon substrate, and U.S. Pat. No. 3,832,700 proposes a non-volatile memory having a ferroelectric film on the gate portion of anMIS-type transistor. Moreover, IDEM '87, pp. 850–851, recently proposes a non-volatile memory having a structure laminating a ferroelectric film on an MOS-type semiconductor device as shown in FIG. 3.

In FIG. 3, reference numeral (301) is a P-type Si substrate, (302) is a LOCOS oxide film for separating elements, (303) is an N-type diffusion layer to be a source, and (304) is an N-type diffusion layer to be a drain. Reference numeral (305) is a gate electrode, and (306) is an interlayer insulating film. Reference numeral (307) is ferroelectric film, sandwiched by electrodes (308) and (309) to construct a capacitor. Reference numeral (310) is a second interlayer insulating film, and (311) is Al as a wiring electrode. The structure laminating a ferroelectric film on the upper portion of a MOS-type semiconductor device, owing to step difference by a capacitor made of a ferroelectric, is worse in adhesion of a wiring layer of aluminum and the like positioned on the upper portion, and has problems such as easily causing open circuit or burnout particularly at the step protion and the like. The invention is to solve the above problems, and aims to provide a semiconductor device having excellent reliability, particularly a non-volatile memory by controlling and flattering step difference by a capacitor with the use of a ferroelectric film.

DISCLOSURE OF THE INVENTION

The invention, in a structure of a memory having a ferroelectric film, embedding a capacitor formed with said ferroelectric film in a through-hole bored in an interlayer insulating film formed on a semiconductor substrate and reduces step difference by said capacitor, thereby improving reliability of a wiring layer passed thereon and increasing reliability of the semiconductor memory.

BEST MODE FOR CARRYING OUT THE INVENTION

Figure 1A:
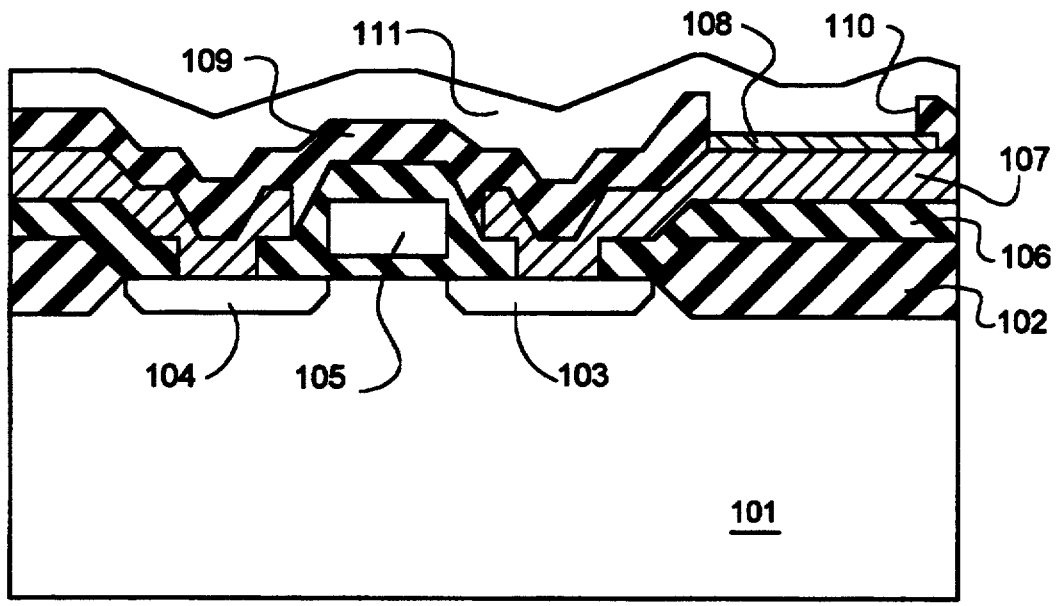
FIG. 1 is cross section of a semiconductor device according to an embodiment of the invention.
Figure 1B:
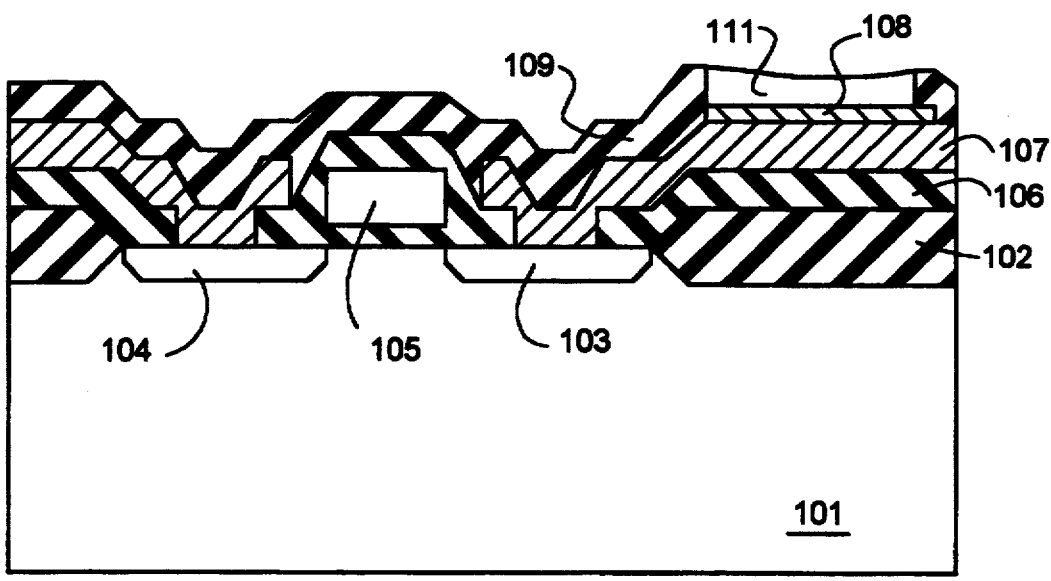
Figure 1C:
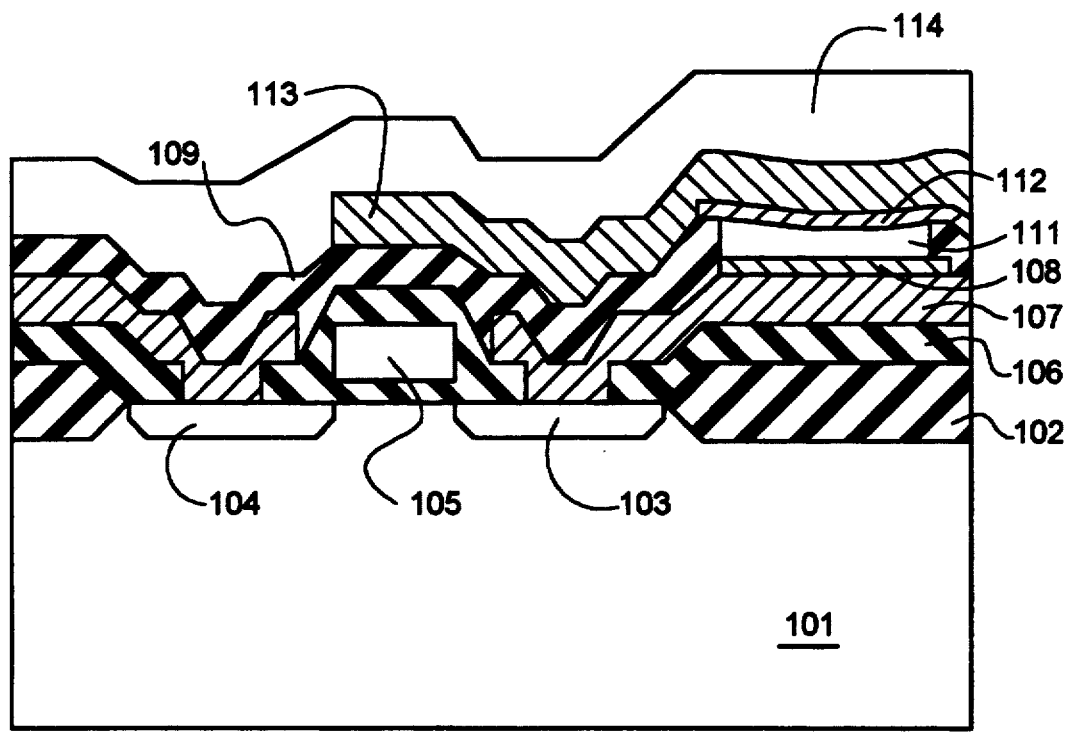

FIGS. 1(a)–(c) are cross sections for showing steps embodiment of the semiconductor device according to the invention. The semiconductor device according to the invention will be explained by referring to FIG. 1 as follows. For the sake of explanation, as an example of forming an N-channel transistor on an Si substrate and using an Al2 layer wiring is explained. [FIG. 1(a)]

Reference numeral (101) is a P-type Si substrate using a wafer of specific resistance such as 20 Ωcm. Reference numeral (102) is an insulating film for element separation, for instance, forming an oxide film into 6000 Å by a LOCOS method known per se. Reference numeral (103) is an N-type diffusion layer as a source fomed by ion implantation of phosphorus with 80 keV $5 \times 10^{15}$ cm$^{-2}$ for example. Reference numeral (104) is an N-type diffusion layer as a drain and simultaniously formed with (103).

Reference numeral (105) is a gate electrode using phosphorus-doped polysilicon for instance. (106) is a first interlayer insulating film of phosphorus glass formed into 4000 Å thickness by a chemical vapor phase growth method for instance and thereafter provided with a contacting hole with the aid of a prior art exposure technique. Reference numeral (107) is a first wiring layer of for example Al formed into 5000 Å thickness. Reference numeral (108) is one electrode of Pt, Pd and the like formed into 1000 Å by sputtering, for instance, of a capacitor using a ferroelectric. Reference numeral (109) is a second interlayer insulating film of phospherus glass formed of 5000 Å by chemical vapor phase growth method for instance, and thereafter a throughhole (110) is fomed by using a prior exposure technique. Reference numeral (111) is a ferroelectric film of for example PbTiO$_3$ formed of 6000 Å by bias sputtering or chemical vapor phase growth method as the main gist of the invention. In this case, the thickness of said ferroelectric film (111) is preferably the same as or more than that of said second interlayer insulating film (109). [FIG. 1(b)]

Next, the whole surface of said ferroelectric film (111) is etched back by reactive etching or sputtering etching. In this case, it is preferable to have no etching residue of said ferroelectric film (111) and to completely fill said ferroelectric film (111) in the through-hole (110), but even if there is the etching residue of the ferroelectric film (111), there is no problem with no conductivity. [FIG. 1(c)]

After the above procedure, as the other electrode (112) of the ferroelectric film Reference numeral (111), Pt, Pd or the like is formed of 1000 Å by sputtering for instance. Then, as a second wiring layer (113), for instance Al is formed of 8000 Å by sputtering. Finally, as a passivation film (114), of for instance SiN is formed of 10,000 Å by a chemical vapor phase growth method to obtain a semiconductor device according to an embodiment of the invention.

With the use of the structure and steps shown in FIG. 1, the step difference by the capacitor with the use of the ferroelectric can be reduced, so as to be possible to improve reliability of the wiring layer passed thereon.

Figure 2:
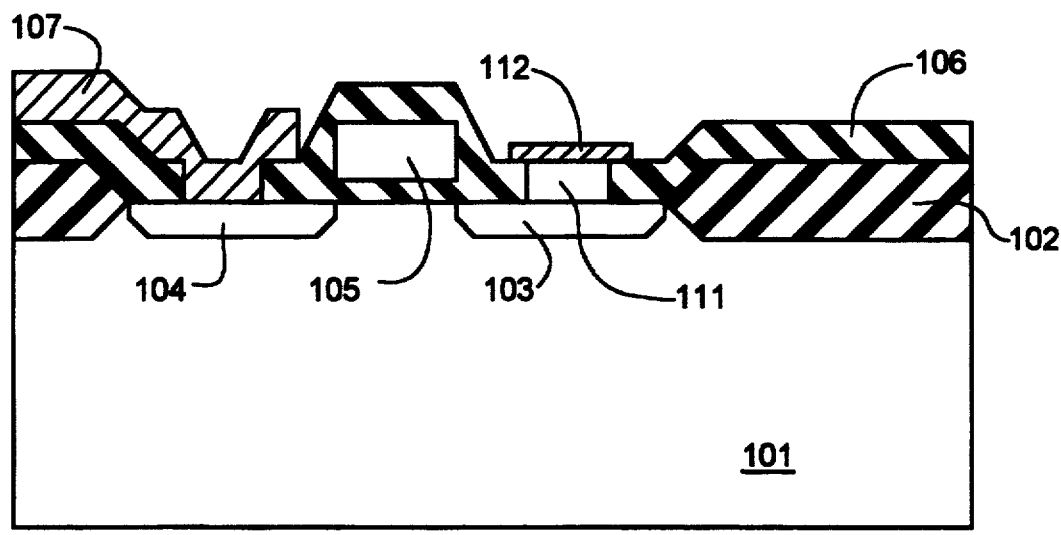
FIG. 2 is a cross section of the semiconductor device according to another embodiment of FIG. 1.
Figure 3:
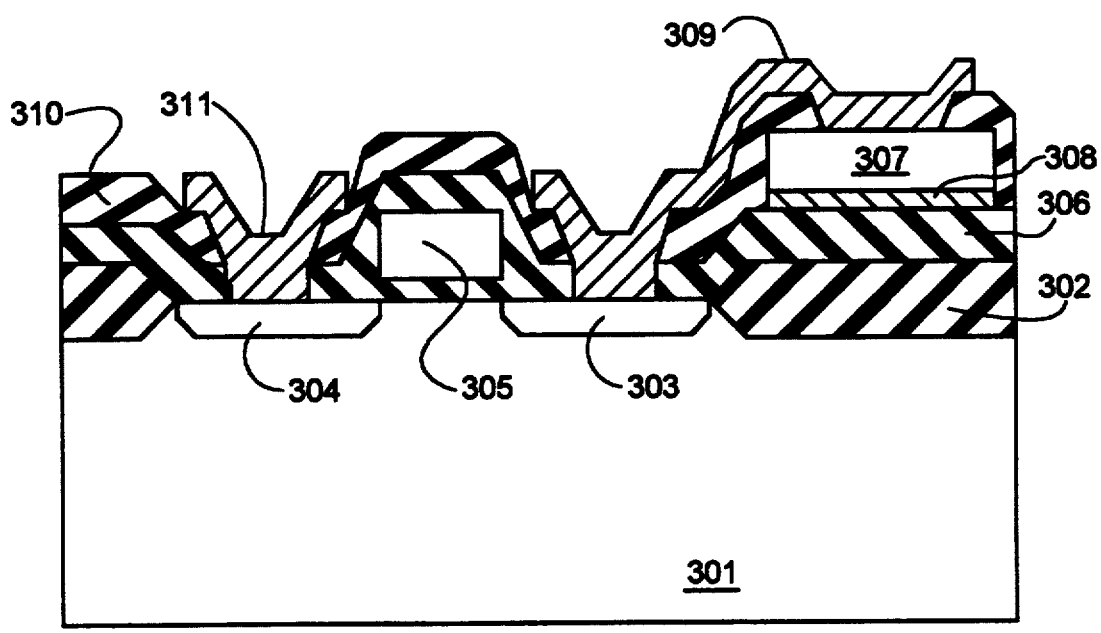
FIG. 3 is a cross section of a semiconductor memory device according to prior art.

As in FIG. 3, when a capacitor with the use of a ferroelectric is formed between a first interlayer insulating film (306) and a second interlayer insulating film (310), a step covering ratio of the wiring layer positioned above was about 15% as compared with the flat portion in cose of Al by sputtering. However, in case of embodying a capacitor with the use of a ferroelectric in a through-hole bored in a second intarlayer insulating film as in the present embodiment, a step covering ratio of the wiring layer positioned above is improved to about 40% as compared with the flat portion in case of Al by sputtering. The same effect can be attained by embedding a capacitor with the use of a ferroelectric in a through-hole bored in a first interlayer insulating film as shown in FIG. 2 for instance.

The non-volatile memory is mainly explained in the above, but the invention can naturally be applied to a memory (DRAM and the like) utilizing large specific permeability of a ferroelectric.

INDUSTRIAL APPLICABILITY

The invention has an effect of improving reliability of a wiring layer passing over a capacitor and obtaining a highly reliable semiconductor memory by embodding the capacitor formed by a ferroelectric film in a through-hole bored in an interlayer insulating film formed on a semiconductor substrate in a structure of a memory with the use of the ferroelectric film, thereby reducing step difference by said capacitor.

I claim:

1. A semiconductor device comprising:
   a substrate with a diffusion region;
   a first insulating film located adjacent to said diffusion region;
   a first wiring layer located over said first insulating film;
   a lower electrode located over said first wiring layer and directly above said first insulating film;
   a second insulating film located over said first wiring layer and said lower electrode;
   a through-hole in said second insulating film extending to said lower electrode, and located directly above said first insulating film;
   a dielectric, comprising a ferroelectric material, embedded in said through-hole and disposed directly above said lower electrode and said first insulating film; and
   an upper electrode located directly above said dielectric and said first insulating film
   wherein said dielectric is at least equal to a thickness of said second insulating film.

2. A semiconductor device comprising:
   a substrate with a diffusion region;
   a first insulating film located adjacent to said diffusion region;
   a first wiring layer located over said first insulating film;
   a lower electrode located over said first wiring layer and directly above said first insulating film;
   a second insulating film located over said first wiring layer and said lower electrode;
   a through-hole in said second insulating film extending to said lower electrode, and located directly above said first insulating film;
   a dielectric, comprising a ferroelectric material, embedded in said through-hole and disposed directly above said lower electrode and said first insulating film;
   an upper electrode located directly above said dielectric and said first insulating film;
   another insulating film disposed over said diffusion region and said first insulating film; and
   another through-hole formed in said another insulating film wherein said another through-hole is disposed over and extends to said diffusion region such that said first wiring layer contacts said diffusion region via said another through-hole.

3. The device of claim 1 wherein said lower electrode is comprised of an element selected from the group comprising Pt and Pd and has a thickness of approximately 1000 Å.

4. The device of claim 1 wherein said ferroelectric material comprises $PbTiO_3$ and has a thickness of approximately 6000 Å.

5. The device of claim 1 wherein said upper electrode is comprised of an element selected from the group comprising Pt and Pb and has an approximate thickness of 6000 Å.

6. The device of claim 1 further comprising a second wiring layer disposed at least over said upper electrode.

7. The device of claim 1 further comprising a second wiring layer located over said upper electrode and a passivation film located over said device.

8. A semiconductor device comprising:
   a substrate with a diffusion region;
   a first insulating film located adjacent to said diffusion region;
   a first wiring layer located over said first insulating film;
   a lower electrode located over said first wiring layer and directly above said first insulating film;
   a second insulating film located over said first wiring layer and said lower electrode;
   a through-hole in said second insulating film extending to said lower electrode, and located directly above said first insulating film;
   a dielectric, comprising a ferroelectric material, embedded in said through-hole and disposed directly above said lower electrode and said first insulating film;
   an upper electrode located directly above said dielectric and said first insulating film;
   another insulating film disposed over said diffusion region and said first insulating film;
   another through-hole formed in said another insulating film wherein said another through-hole is disposed over and extends to said diffusion region such that said first wiring layer contacts said diffusion region via said another through-hole; and
   a second wiring layer located over said upper electrode and a portion of said another insulating layer and a passivation film located over said device.

9. The device of claim 2 wherein said ferroelectric material comprises $PbTiO_3$ and has a thickness of approximately 6000 Å.

10. The device of claim 2 wherein said lower electrode is comprised of an element selected from the group comprising Pt and Pd and has a thickness of approximately 1000 Å.

11. The device of claim 2 wherein said upper electrode is comprised of an element selected from the group comprising Pt and Pb and has an approximate thickness of 6000 Å.

12. The device of claim 2 further comprising a second wiring layer disposed at least over said upper electrode.

13. The device of claim 2 further comprising a second wiring layer located over said upper electrode and a passivation film located over said device.

14. The device of claim 8 wherein said lower electrode is comprised of an element selected from the group comprising Pt and Pd and has a thickness of approximately 1000 Å.

15. The device of claim 8 wherein said ferroelectric material comprises $PbTiO_3$ and has a thickness of approximately 6000 Å.

16. The device of claim 8 wherein said upper electrode is comprised of an element selected from the group comprising Pt and Pb and has an approximate thickness of 6000 Å.

* * * * *

UNITED STATES PATENT AND TRADEMARK OFFICE
CERTIFICATE OF CORRECTION

PATENT NO. : 5,369,296

DATED : November 19, 1994

INVENTOR(S) : Koji Kato

It is certified that error appears in the above-indentified patent and that said Letters Patent is hereby corrected as shown below:

Title page and Cols. 1-6 should be deleted and the attached
Title page and Cols. 1-6 should be inserted.

Signed and Sealed this

Twenty-fifth Day of March, 1997

Attest:

BRUCE LEHMAN

Attesting Officer

Commissioner of Patents and Trademarks

United States Patent [19]
Kato

[11] Patent Number: 5,369,296
[45] Date of Patent: Nov. 29, 1994

[54] SEMICONDUCTOR DEVICE HAVING A FERROELECTRIC FILM IN A THROUGH-HOLE

[75] Inventor: Koji Kato, Suwa, Japan

[73] Assignee: Ramtron International Corporation, Colorado Springs, Colo.

[21] Appl. No.: 139,340

[22] Filed: Oct. 19, 1993

Related U.S. Application Data

[63] Continuation of Ser. No. 842,394, May 12, 1992, abandoned.

[30] Foreign Application Priority Data

Jul. 24, 1990 [JP] Japan .................. 2-195864

[51] Int. Cl.⁵ .................. H01L 29/78; G11C 11/22
[52] U.S. Cl. .................. 257/295; 257/310; 365/145; 361/321.2
[58] Field of Search .................. 257/295, 296, 314; 365/145

[56] References Cited

U.S. PATENT DOCUMENTS

| | | | |
|---|---|---|---|
| 4,149,302 | 4/1979 | Cook | 29/25.42 |
| 5,046,043 | 9/1991 | Miller et al. | 365/145 |
| 5,099,305 | 3/1992 | Takenaka | 365/145 |
| 5,119,154 | 6/1992 | Gnadinger | 257/295 |
| 5,216,572 | 6/1993 | Larson et al. | 257/295 |

FOREIGN PATENT DOCUMENTS

| | | | |
|---|---|---|---|
| 0338157 | 10/1989 | European Pat. Off. | G11C 11/22 |
| 62-61355 | 3/1987 | Japan . | |
| 2-49471 | 2/1990 | Japan | 257/295 |
| 2-94559 | 4/1990 | Japan . | |
| 2-183569 | 7/1990 | Japan | 257/295 |

Primary Examiner—Robert Limanek
Attorney, Agent, or Firm—Edward D. Manzo; Mark J. Murphy

[57] ABSTRACT

A memory device having a ferroelectric film. The memory device embeds a capacitor formed with a ferroelectric film in a through-hole bored in an interlayer insulating film forme on a semiconductor substrate. High reliability is achieved by a wiring layer disposed on the capacitor to reduce the step difference of the capacitor.

16 Claims, 3 Drawing Sheets

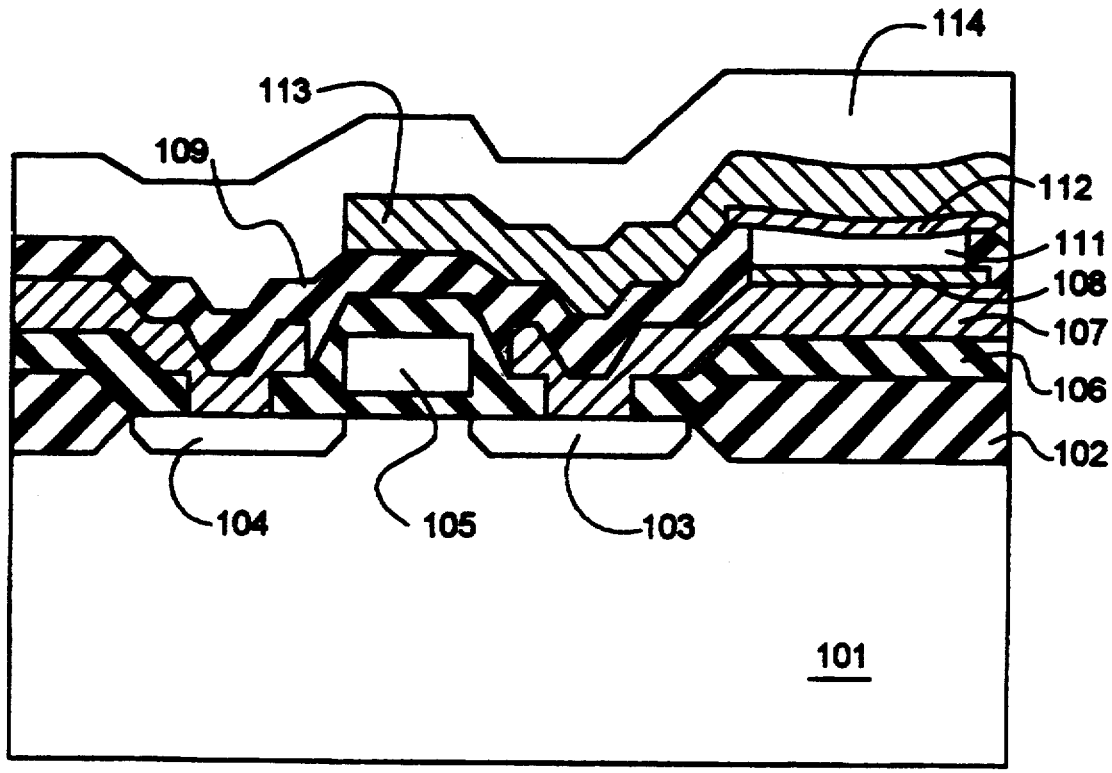

SEMICONDUCTOR DEVICE HAVING A FERROELECTRIC FILM IN A THROUGH-HOLE

FIELD OF THE INVENTION

The present invention relates to a memory device and more particularly to an electrically rewritable non-volatile memory having a ferroelectric dielectric.

BACKGROUND OF THE INVENTION

Semiconductor non-volatile memory devices have commonly used an MIS-type transistor which modulates a surface potential of its silicon substrate by injecting a charge from the silicon substrate into a trap or a floating gate contained in an insulating gate. Examples of such devices are EPROMs (ultraviolet erasable-type non-volatile memories), EEPROMs (electrically rewritable non-volatile memories), and the like.

However, these non-volatile memories have many performance limitations including a high write voltage (about 20 volts), a high write time (tens of msec), and limited writes (about 10,000).

A non-volatile memory utilizing an electrically polarization reversible ferroelectric, wherein write and read times are substantially the same and polarization is maintained even if the power supply source is cut off, has the possibility of exhibiting characteristics of an ideal non-volatile memory.

U.S. Pat. No. 4,149,302 discloses a structure integrating a capacitor consisting of a ferroelectric silicon substrate. U.S. Pat. No. 3,832,700 discloses a non-volatile memory having a ferroelectric film on the gate portion of an MIS-type transistor. IDEM '87 pp. 850–851 discloses a non-volatile memory having a structure laminating a ferroelectric film on an MOS-type semiconductor device as shown in application FIG. 3.

In FIG. 3, reference numeral 301 denotes a P-type Si substrate, 302 denotes a LOCOS oxide film for separating elements, 303 denotes an N-type diffusion layer to be a source region, and 304 denotes an N-type diffusion layer to be a drain region. Reference numeral 305 denotes a gate electrode, and 306 denotes an interlayer insulating film. Reference numeral 307 denotes a ferroelectric film, disposed between a lower electrode 308 and an upper electrode 309 to form a capacitor. Reference numeral 310 denotes a second interlayer insulating film, and 311 denotes an Al wire.

A structure with a ferroelectric capacitor formed on top of an interlayer insulating film that has been formed over a MOS semiconductor device creates severe topography with very high steps. This topography leads to loss of adhesion and poor aluminum step coverage. This in turn causes problems with circuit functionality and reliability.

Therefore, a general object of the present invention is to solve the above-problems. Another object of the present invention is to provide a semiconducutor device having excellent reliability, particularly a non-volatile memory, by making a ferroelectric capacitor device with a more planar structure.

SUMMARY OF THE INVENTION

The present invention provides a memory device having a ferroelectric film and embedding a capacitor formed with the ferroelectric film in a through-hole bored in an interlayer insulating film formed on a semiconductor substrate. This reduces the step difference caused by the capacitor, thereby improving the reliability of a wiring layer disposed thereon and increasing the reliability of the semiconductor memory.

BRIEF DESCRIPTION OF THE DRAWINGS

FIG. 1 is a cross section of a semiconductor device according to an embodiment of the present invention;

FIG. 2 is a cross section of the semiconductor device according to another embodiment of FIG. 1.

FIG. 3 is a cross section of the semiconductor memory device according to a prior art.

DETAILED DESCRIPTION OF THE PREFERRED EMBODIMENT

FIGS. 1(a)–(c) are cross sections showing the steps for manufacturing a semiconductor device according to a preferred embodiment of the present invention. The semiconductor device according to the present invention will be explained by referring to FIGS. 1(a)–(c).

As an example of forming an N-channel transistor on an silicon substrate and using an Al layer wiring is explained with reference to FIG. 1(a). Reference numeral 101 denotes a preferred P-type silicon substrate having a specific resistance, for example, of about 20 $\Omega \cdot$cm. Reference numeral 102 denotes a preferred insulating film for element separation formed of an oxide film with a thickness of 6000 Å by a LOCOS method known in the art. Reference numeral 103 denotes a preferred N-type diffusion layer which will function as a source after being formed by an ion implantation of phosphorus at 80 keV to a concentration of $5 \times 10^{15}$ cm$^{-2}$, for example. Reference numeral 104 denotes a preferred N-type diffusion layer which will function as a drain region, and is simultaneously formed with source region 103.

Reference numeral 105 denotes a preferred gate electrode using phosphorus-doped polysilicon. Reference numeral 106 denotes a preferred first interlayer insulating film of phosphorus glass formed to a thickness of 4000 Å by a preferred chemical vapor phase growth method. A contacting hole is provided by a prior art exposure technique through first interlayer insulating film 106 to the surface of source region 103. Reference numeral 107 denotes a preferred first wiring layer of, for example, Al formed to a 5000 Å thickness. Reference numeral 108 denotes a lower electrode preferably of Pt, Pd and the like, formed to a thickness of 1000 Å preferably by sputtering. Reference numeral 109 denotes a preferred second interlayer insulating film of phosphorus glass formed to a thickness of 5000 Å by a preferred chemical vapor phase growth method. A preferred through-hole 110 is formed through second interlayer insulating film 109 to the surface of lower electrode 108 by using a conventional exposure technique. Reference numeral 111 denotes a preferred ferroelectric film of, for example, PbTiO$_3$, formed to a thickness of 6000 Å by a bias sputtering or a chemical vapor phase growth method. The thickness of ferroelectric film 111 is preferably equal to or greater than that of second interlayer insulating film 109 (see FIG. 1(b)).

The entire surface of ferroelectric film 111 is etched back preferably by reactive or sputtering etching. For the preferred embodiment it is preferable not to have etching residue of ferroelectric film 111. It is also preferable to completely fill the through-hole 110 with ferroelectric film 111. Any etching residue of the ferroelectric film 111 will not cause a problem with the capacitor conductivity (see FIG. 1(c)).

After the above procedure, an upper electrode 112 of the ferroelectric film 111 is preferably formed of Pt, Pd or the like to a thickness of 1000 Å by sputtering. Then a second wiring layer 113, of for example Al, is formed to a thickness of 8000 Å preferably by sputtering. Finally, a passivation film 114, of for example SiN, is formed to a thickness of 10,000 Å preferably by a chemical vapor phase growth method to obtain a semiconductor device according to a preferred embodiment of the present invention.

The use of the method steps to make the structure shown in FIGS. 1(a)–(c) results in a more planar ferroelectric capacitor device. This results in improved step coverage of the wiring layer displaced thereon and hence an improvement in the reliability of the device.

As shown in FIG. 3, a capacitor with a ferroelectric formed between a first interlayer insulating film 306 and a second interlayer insulating film 301 has a step covering ratio of the wiring layer 311, positioned above the capacitor, of about 15% as compared with the flat portion in the case of Al by sputtering. However, a capacitor with a ferroelectric embedded in a through-hole bored in a second interlayer insulating film, as in the present embodiment, has a step covering ratio of the wiring layer positioned above the capacitor improved to about 40% as compared with the flat portion in the case of Alas in the present embodiment by sputtering. The same effect can be attained by embedding a capacitor with a ferroelectric in a through-hole bored in a first interlayer insulating film as shown in FIG. 2.

Although a non-volatile memory is explained above, the present invention can be applied to other memory devices, such as a DRAM and the like, utilizing a large specific permeability of a ferroelectric.

The present invention improves the reliability of a wiring layer passing over a capacitor and obtains a highly reliable semiconductor memory by embedding the capacitor formed with a ferroelectric film in a through-hole in an interlayer insulating film formed on a semiconductor substrate thereby reducing the step difference of the capacitor.

I claim:

1. A semiconductor device comprising:
   a substrate with a diffusion region;
   a first insulating film located adjacent to said diffusion region;
   a first wiring layer located over said first insulating film;
   a lower electrode located over said first wiring layer and directly above said first insulating film;
   a second insulating film located over said first wiring layer and said lower electrode;
   a through-hole in said second insulating film extending to said lower electrode, and located directly above said first insulating film;
   a dielectric, comprising a ferroelectric material, embedded in said through-hole and disposed directly above said lower electrode and said first insulating film; and
   an upper electrode located directly above said dielectric and said first insulating film wherein said dielectric is at least equal to a thickness of said second insulating film.

2. A semiconductor device comprising:
   a substrate with a diffusion region;
   a first insulating film located adjacent to said diffusion region;
   a first wiring layer located over said first insulating film;
   a lower electrode located over said first wiring layer and directly above said first insulating film;
   a second insulating film located over said first wiring layer and said lower electrode;
   a through-hole in said second insulating film extending to said lower electrode, and located directly above said first insulating film;
   a dielectric, comprising a ferroelectric material, embedded in said through-hole and disposed directly above said lower electrode and said first insulating film;
   an upper electrode located directly above said dielectric and said first insulating film;
   another insulating film disposed over said diffusion region and said first insulating film; and
   another through-hole formed in said another insulating film wherein said another through-hole is disposed over and extends to said diffusion region such that said first wiring layer contacts said diffusion region via said another through-hole.

3. The device of claim 1 wherein said lower electrode is comprised of an element selected from the group comprising Pt and Pd and has a thickness of approximately 1000 Å.

4. The device of claim 1 wherein said ferroelectric material comprises $PbTiO_3$ and has a thickness of approximately 6000 Å.

5. The device of claim 1 wherein said upper electrode is comprised of an element selected from the group comprising Pt and Pb and has an approximate thickness of 6000 Å.

6. The device of claim 1 further comprising a second wiring layer disposed at least over said upper electrode.

7. The device of claim 1 further comprising a second wiring layer located over said upper electrode and a passivation film located over said device.

8. A semiconductor device comprising:
   a substrate with a diffusion region;
   a first insulating film located adjacent to said diffusion region;
   a first wiring layer located over said first insulating film;
   a lower electrode located over said first wiring layer and directly above said first insulating film;
   a second insulating film located over said first wiring layer and said lower electrode;
   a through-hole in said second insulating film extending to said lower electrode, and located directly above said first insulating film;
   a dielectric, comprising a ferroelectric material, embedded in said through-hole and disposed directly above said lower electrode and said first insulating film;
   an upper electrode located directly above said dielectric and said first insulating film;
   another insulating film disposed over said diffusion region and said first insulating film;
   another through-hole formed in said another insulating film wherein said another through-hole is disposed over and extends to said diffusion region such that said first wiring layer contacts said diffusion region via said another through-hole; and
   a second wiring layer located over said upper electrode and a portion of said another insulating layer and a passivation film located over said device.

9. The device of claim 2 wherein said ferroelectric material comprises $PbTiO_3$ and has a thickness of approximately 6000 Å.

10. The device of claim 2 wherein said lower electrode is comprised of an element selected from the group comprising Pt and Pd and has a thickness of approximately 1000 Å.

11. The device of claim 2 wherein said upper electrode is comprised of an element selected from the group comprising Pt and Pd and has an approximate thickness of 6000 Å.

12. The device of claim 2 further comprising a second wiring layer disposed at least over said upper electrode.

13. The device of claim 2 further comprising a second wiring layer located over said upper electrode and a passivation film located over said device.

14. The device of claim 8 wherein said lower electrode is comprised of an element selected from the group comprising Pt and Pd and has a thickness of approximately 1000 Å.

15. The device of claim 8 wherein said ferroelectric material comprises $PbTiO_3$ and a thickness of approximately 6000 Å.

16. The device of claim 8 wherein said upper electrode is comprised of an element selected from the group comprising Pt and Pb and has an approximate thickness of 6000 Å.

* * * * *